United States Patent
Zhu

(10) Patent No.: US 7,602,038 B2
(45) Date of Patent: Oct. 13, 2009

(54) DAMASCENE STRUCTURE HAVING A REDUCED PERMITTIVITY AND MANUFACTURING METHOD THEREOF

(75) Inventor: Jun Zhu, Shanghai (CN)

(73) Assignees: Shanghai IC R&D Center, Shanghai (CN); Shanghai Huahong (Group) Co., Ltd, Shanghai (CN)

( * ) Notice: Subject to any disclaimer, the term of this patent is extended or adjusted under 35 U.S.C. 154(b) by 8 days.

(21) Appl. No.: 11/645,624

(22) Filed: Dec. 27, 2006

(65) Prior Publication Data
US 2007/0182013 A1   Aug. 9, 2007

(30) Foreign Application Priority Data
Dec. 31, 2005   (CN)   ................ 2005 1 0003374

(51) Int. Cl.
H01L 21/76   (2006.01)
H01L 21/4763   (2006.01)

(52) U.S. Cl. ............... 257/522; 438/422; 438/627; 257/E21.573

(58) Field of Classification Search ............ 257/522, 257/E21.573; 438/411, 421, 422, 627
See application file for complete search history.

(56) References Cited

U.S. PATENT DOCUMENTS

| | | | |
|---|---|---|---|
| 5,759,913 A | 6/1998 | Fulford, Jr. et al. | |
| 6,211,561 B1 | 4/2001 | Zhao | |
| 6,268,277 B1 | 7/2001 | Bang | |
| 6,406,992 B1 | 6/2002 | Mao et al. | |
| 6,555,467 B2 | 4/2003 | Hsu et al. | |
| 6,713,835 B1 | 3/2004 | Horak et al. | |
| 6,737,725 B2 * | 5/2004 | Nitta et al. | 257/522 |
| 6,861,332 B2 * | 3/2005 | Park et al. | 438/421 |
| 6,984,577 B1 * | 1/2006 | Zhao et al. | 438/619 |
| 7,071,532 B2 * | 7/2006 | Geffken et al. | 257/522 |
| 2002/0001952 A1 * | 1/2002 | Chooi et al. | 438/687 |
| 2002/0127844 A1 * | 9/2002 | Grill et al. | 438/622 |
| 2003/0127740 A1 * | 7/2003 | Hsu et al. | 257/758 |
| 2006/0040492 A1 * | 2/2006 | Goodner et al. | 438/638 |

* cited by examiner

Primary Examiner—Hsien-ming Lee
Assistant Examiner—Kevin Parendo
(74) Attorney, Agent, or Firm—Finnegan, Henderson, Farabow, Garrett & Dunner, LLP

(57) ABSTRACT

A semiconductor device includes a damascene structure and an air gap embedded in the damascene dielectric layer. A method of manufacturing a semiconductor device includes depositing a metal barrier in advance as an etch stop, forming a copper damascene interconnect structure, forming an air gap, and depositing a photosensitive passivation material on the air gap.

11 Claims, 5 Drawing Sheets

DAMASCENE STRUCTURE HAVING A
REDUCED PERMITTIVITY AND
MANUFACTURING METHOD THEREOF

This application claims the benefit of priority from prior People's Republic of China Patent Application No. 200510003374.X, filed Dec. 31, 2005, the entire contents of which are incorporated herein by reference.

BACKGROUND OF THE INVENTION

1. Field of the Invention

The present invention is directed to semiconductor manufacturing. More specifically, this invention relates to a damascene structure having a reduced permittivity and a manufacturing method thereof.

2. Description of the Related Art

Recent developments in semiconductor process technology have led to a decrease in device dimension and an increase in signal speed. With smaller and faster devices, conductive interconnect structures in devices play an increasingly significant role in device performance. A major area of concern is the resistance and capacitance (RC) delay associated with the interconnect structures of devices. As device dimensions become smaller, the RC delay causes greater signal propagation delay and has a larger effect on overall operating speed. Moreover, the RC delay also contributes to power dissipation.

Various efforts have been made to minimize the RC delay effect of interconnections. For example, one way to minimize the RC delay is by reducing the resistance of the interconnect structures. Aluminum interconnects had been widely used in semiconductor devices for decades. With the reduction in chip size, however, aluminum interconnects have been largely replaced by copper, which has a lower resistance than aluminum, in order to the RC delay. As a result, copper processing technology, e.g., copper Back End Of line (BEOL) processing, has been extensively developed. Copper BEOL processing involves damascene interconnection processes, in which trenches are formed in a layer of dielectric material, and copper is used to fill the trenches to form the interconnection. However, there is still a need to further reduce the RC delay of the interconnection, and improve the signal speed.

SUMMARY OF THE INVENTION

In accordance with the present invention, there is provided a semiconductor device comprising an etch barrier layer, a dielectric layer over the etch barrier layer, a conductive metal interconnect formed in a first region of the semiconductor device and through the dielectric layer and etch barrier layer, a metal barrier layer formed in a second region of the semiconductor device different from the first region and over the etch barrier layer, an air gap formed in the second region and extending though the dielectric layer and to the metal barrier layer, an upper photosensitive passivation material formed at least over a top portion of the air gap, and a lower photosensitive passivation material formed at a bottom portion of the air gap on the metal barrier layer.

Also in accordance with the present invention, there is provided a method of manufacturing a semiconductor device comprising forming an etch barrier layer, forming a dielectric layer on the etch barrier layer, forming a metal barrier layer over the etch barrier layer in a first region, forming a metal interconnection through the dielectric layer and the etch barrier in a second region different from the first region, forming a metal passivation layer on an uppermost portion of the metal interconnection, applying and patterning a first photosensitive material on the metal passivation layer, etching the metal passivation layer using the patterned photosensitive material to expose the uppermost portion of the metal interconnection, removing the patterned first photosensitive material, applying and patterning a second photosensitive material on the metal passivation layer and the exposed uppermost portion of the metal interconnection, etching the first region to form an air gap extending to the metal barrier layer, the first region being substantially free of metal Interconnections, removing the pattered second photosensitive material, applying a photosensitive passivation material on the air gap, etching the photosensitive passivation material to expose the uppermost portion of the metal Interconnection, and baking the semiconductor device.

It is to be understood that both the foregoing general description and the following detailed description are exemplary and explanatory and are not restrictive of the invention, as claimed.

The accompanying drawings, which are incorporated in and constitute a part of this specification, illustrate embodiments of the invention and, together with the description, serve to explain the principles of the invention.

DETAILED DESCRIPTION OF THE EMBODIMENTS

Damascene structures include conductive metal interconnects formed within a dielectric material. The RC delay of a damascene structure can be reduced in two ways: by reducing the resistance of the conductive metal interconnects (e.g., by using copper instead of aluminum), and by reducing the capacitance of the dielectric material. The following equation describes line-to-line capacitance:

$$C = 2(C_l + C_v) = 2k\varepsilon_0 LTW\left(\frac{1}{W^2} + \frac{1}{T^2}\right) \quad \text{(Equation 1)}$$

wherein k is peminittivily, W is the width of each metal line; T is the depth of the metal lines; L is the length of the metal lines; $\varepsilon_o$ is vacuum permittivity; $C_l$ is longitudinal capacitance; and $C_v$ is transverse capacitance. As Equation 1 shows, the line-to-line capacitance is directly proportional to permittivity. That is, with a lower permittivity, a smaller line-to-line capacitance can be obtained.

Next, the following equation describes line-to-line RC delay:

$$RC_{delay} = 2\rho k\varepsilon_0 L^2 \left(\frac{1}{W^2} + \frac{1}{T^2}\right) \quad \text{(Equation 2)}$$

wherein k is permittivity; p is the metal resistivity; W is the width of each metal line; T is the depth of the metal lines; L is the length of the metal lines; $\in_o$ is vacuum permittivity. Again, the line-to-line RC delay is, directly proportional to permittivity. Thus, a lower permittivity, or a lower dielectric constant, will lead to a smaller capacitance, and a reduction in line-to-line RC delay.

Generally, materials having a dielectric constant of about 4 or less are regarded as materials with a low permittivity. One example such a material is silicon dioxide, which has a permittivity of 3.9. Permittivity of vacuum is defined as 1. Permittivity of air is known to be about 1.00054 at room temperature, Thus, the present inventors have considered forming one or more air gaps in a semiconductor device having a damascene structure, in order to reduce the permittivity, and consequently reduce the undesirable RC delay effect on the device.

Figure 1:
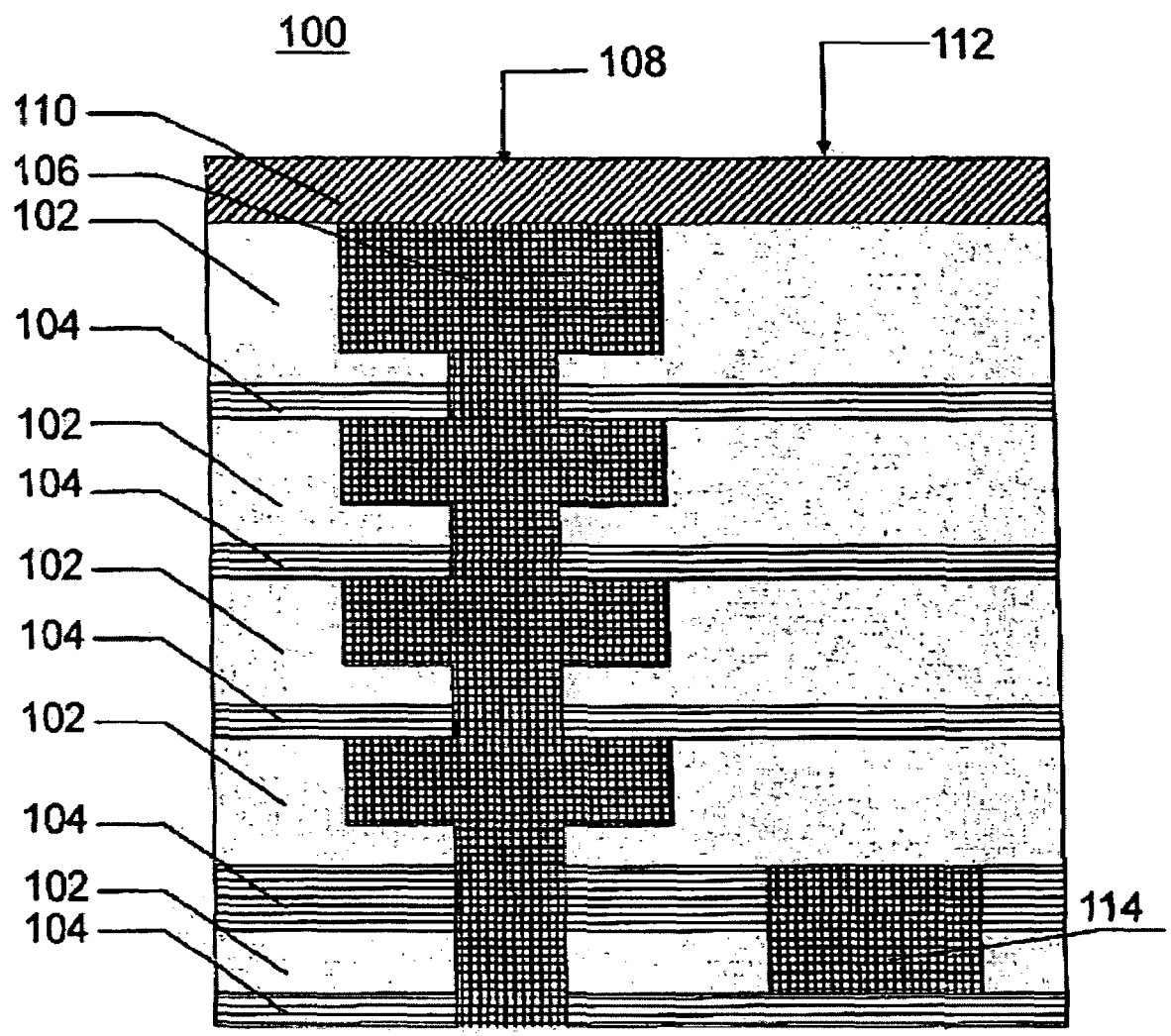
FIG. 1 illustrates process steps consistent with an embodiment of the invention for forming an interconnect structure.

FIG. 1 illustrates a structure consistent with an embodiment of the invention. A semiconductor device 100 is shone. Semiconductor device 100 includes alternating layers of a damascene dielectric layer 102 and an etch barrier layer 104. Semiconductor device 100 may include one or more layers of each of damascene dielectric layer 102 and etch barrier layer 104. Each damascene dielectric layer 102 preferably has a thickness of between 200 nm and 10,000 nm. Each etch barrier layer 104 preferably has a thickness of between 10 nm and 200 nm. Various materials may be used in damascene dielectric layers 102 and etch barrier is 104. For example $SiO_2$ or FSG (fluorosllicate glass) may be used to form damascene dielectric layers 102 Etch barrier layers 104 may be formed from SiN, SiC, or SiON.

A copper interconnect 106 is formed within a region 108 embedded within alternating layers of damascene dielectric layer 102 and etch barrier layer 104. A metal passivation layer 110 is disposed on an uppermost portion of copper interconnect 106 and damascene dielectric layer 102. Metal passivation layer 110 preferably has a thickness of between 100 nm and 10,000 nm. A variety of materials may be used to form metal passivation layer 110, such as $SiO_2$, SiN, SiC, or SiON.

At least one region 112 in semiconductor device 100 is predetermined and reserved for subsequently forming an air gap. Copper interconnect 108 permittivity is formed within region 108 and not formed within region 112. Exemplary values for the size of region 112, in which an air gap is to be formed, may be selected from the following group: 2×2 square microns, 3×3 square microns, 4×4 square microns, 5×5 square microns, 3×2 square microns, 4×2 square microns, 5×2 square microns, 4×3 square microns, 5×3 square microns, 5×4 square microns, In addition, a metal barrier layer 114 is embedded in region 112 reserved for forming an air gap. Metal layer 114 serves as an etch stop during formation of the air gap and may be formed on one of the etch barriers layers 104 in the present example, metal barrier layer 114 is formed on the lowest one of the illustrated etch barrier layers 104. A typical thickness of metal barrier layer 114 ranges from 200 nm to 10,000 nm. A number of metal or metal alloys can be used form metal layer 114, such as copper, TaN, or Ta.

Figure 2:
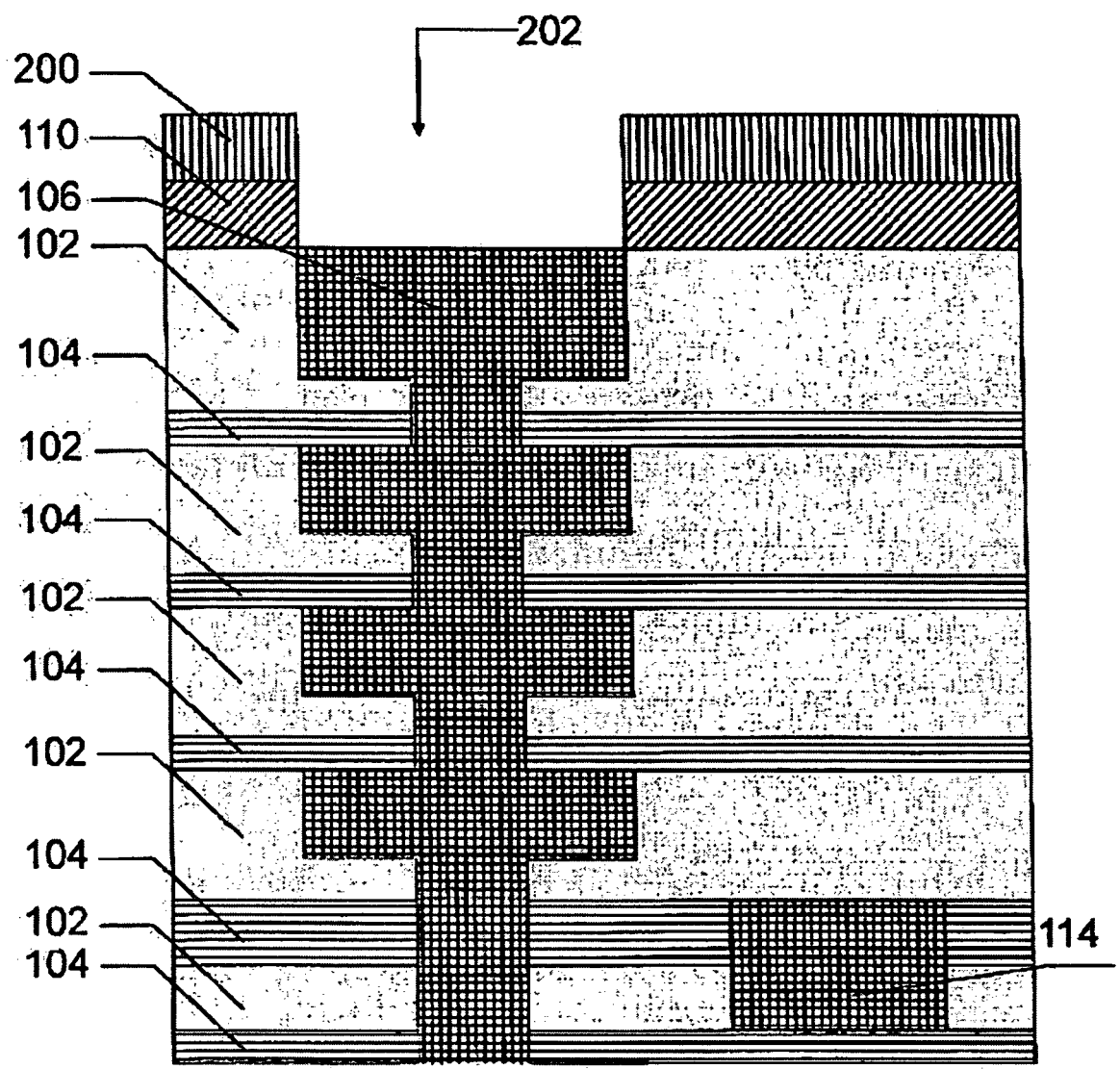
FIG. 2 illustrates further process steps consistent with an embodiment of the invention for forming an interconnect structure.

Next, in FIG. 2, a form photosensitive material 200 is applied onto metal passivation layer 110. First photosensitive material 200 may comprise an organic solvent, anti-reflective material, cross-linking resin, and micro metal ions. Examples of suitable micro metal ions include Fe, Cu, Na, or K. Various organic solvents may be used. For example, ketone, aether, or paraffin organic solvent may be used as an organic solvent. First photosensitive material 200 may have a molecular weight of between 5000 and 50,000. In addition, a molar weight ratio of the organic solvent to cross-linking resin may be 1:X, wherein X preferably ranges from 5 to 100. The thickness of first photosensitive material 200 may vary depending on the manufacturing process, and may be between 100 nm and 850 nm.

One exemplary method of applying first photosensitive material 200 on metal passivation layer 110 is described. First photosensitive material 200 may be applied by means of coating. For example, 1.5 ml to 5 ml of first photosensitive material 200 may be applied by spin coating onto the entire surface of the wafer that includes device 100 being fabricated, thus coating the surface of metal passivation 110. Thereafter, semiconductor device 100 includes first photosensitive material 200 may be soft-baked. A temperature for soft-baking generally ranges from 60° C. to 250° C. For example, first photosensitive material 200 may be soft-baked at 60° C. 80° C. or 120° C. Soft-baking time generally ranges from 10 seconds to 120 seconds. For example, soft-baking may be performed for an arbitrary duration of 60 seconds, 80 seconds, 100 seconds, or 120 seconds.

First photosensitive material 200 may then be patterned using lithographic methods in order to form a pattern 202. Metal passivation layer 110 may then be etched using pattern 202 to expose a top surface of copper interconnect 106. The remaining portions of first photosensitive material 200 may be stripped, and semiconductor device 100 is cleaned.

Figure 3:
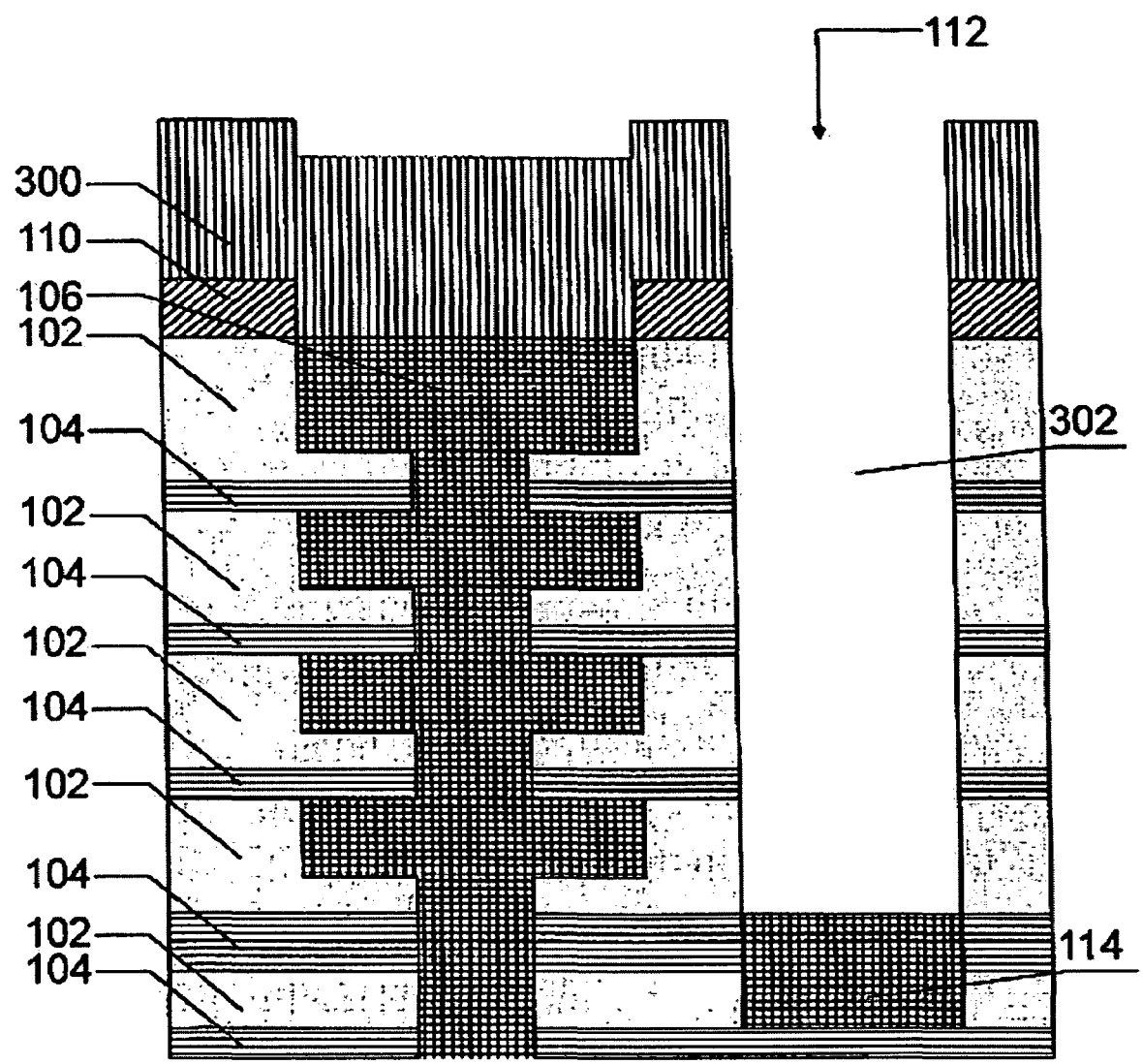
FIG. 3 illustrates further process steps consistent with an embodiment of the invention for forming an interconnect structure.

Referring to FIG. 3, a second photosensitive material 300 is disposed on metal passivation layer 110. Second photosensitive material 300 may comprise an organic solvent, anti-reflective material, cross-linking resin, and micro metal ions. As in the case of first photosensitive material 200, various organic solvents may be used. For example, ketone, aether, or paraffin organic solvent may be used as an organic solvent. Second photosensitive material 300 may have a molecular weight of between 5000 and 50,000. In addition, a molar weight ratio of the organic solvent to cross-linking resin may be 1:X, wherein X preferably ranges from 20 to 1000. The thickness of second photosensitive material 300 may be varied depending on the manufacturing process, and may be between 1000 nm and 5000 nm.

One exemplary method of applying second photosensitive material 300 on metal passivation layer 110 is described. Second photosensitive material 300 may be applied by means of coating. For example, 5 ml to 15 ml of second photosensitive material 300 may be applied by spin coating onto the entire surface of the wafer that includes device 100 being fabricated, thus coating the top surface of metal passivation layer 110 and copper interconnect 106. Thereafter, semiconductor device 100 including second photosensitive material 300 may be soft-baking. As In the case of first photosensitive material 200, the temperature for soft-baking generally ranges from 60° C. to 250° C. For example, second photosensitive material 300 may be soft-baking at 60° C., 80° C. or 120° C. soft-baking time generally ranges from 10 seconds to 120 seconds. For example, soft-baking may be performed for an arbitrary duration of 60 seconds, 80 seconds, 100 seconds, or 120 seconds.

Second photosensitive material 300 may be partially removed within region 112 in which copper interconnect 106 is not formed, using lithographic methods. Metal passivation layer 110, damascene dielectric layer 102 and etch barrier layer 104 are subsequently etched to form an air gap 302. The etching process may be repeated, if necessary, to remove all of damascene dielectric layers 102 and etch barrier layers 104 within region 112 to form air gap 302. The etching process stops at metal barrier layer 114. Air gap 302 is thus formed in region 112 of semiconductor 100. The size of air gap 302 may typically have, in cross section, a length between 2 μm to 5 μm and a width of between 2 μm to 5 μm, and a depth of 500 μm to 100,000 μm. After forming air gap 302, the remaining portions of second photosensitive material 300 may be, and semiconductor device 100 is cleaned.

Figure 4:
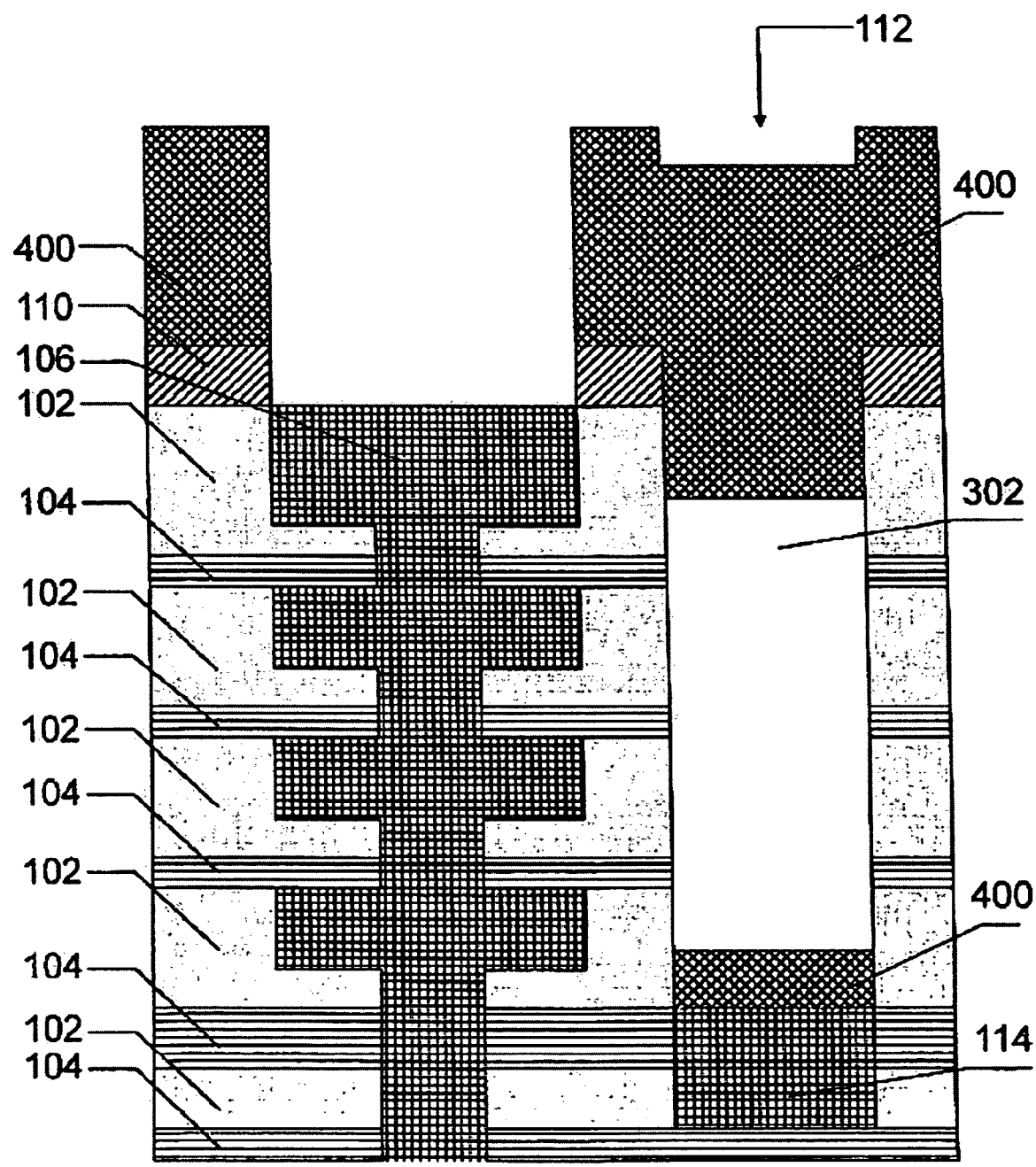
FIG. 4 illustrates further process steps consistent with an embodiment of the invention for forming an interconnect structure.

In FIG. 4, a photosensitive passivation material 400 is deposited on semiconductor device 100. Photosensitive passivation material completes the formation of air gap 302 by covering the top and-bottom air gap 302. Photosensitive passivation material 400 may serve to, protect air gap 302 by preventing ultraviolet radiation and cosmic particles from penetrating into air gap 302. In addition, photosensitive passivation material 400 may protect semiconductor device 100 by absorbing mechanical stresses applied to the device.

Photosensitive passivation material 400 may comprise an organic solvent, photosensitive cross-linking polyimide resin, and micro metal ions. Various organic solvents may be used. For example, ketone, aether, or paraffin organic solvent may be used as an organic solvent Photosensitive passivation material 400 may have a molecular weight of between 50,000 and 500,000. Photosensitive passivation material 400 preferably has a permittivity of 1.0 and 4.0. In addition, a molar weight ratio of the organic solvent to photosensitive cross-linking polyimide resin may be 1:X wherein X preferably ranges from 5 to 10,000.

Photosensitive passivation material 400 may be deposited by repeating the steps of coating a layer of material and baking it. For example, the steps of coating a layer of material and baking it may be repeated between one and ten times. Here, one exemplary method of disposing photosensitive passivation material 400 is described. First, photosensitive passivation material 400 may be applied in a first coating. For example, 1.5 ml to 2 ml of photosensitive passivation material 400 may be applied by spin coating over the entire surface of the wafer that includes device 100 being fabricated. As a result, photosensitive passivation material 400 may cover the top surface of metal passivation layer 110 and copper interconnect 106, over air gap 302, and even into air gap 302, reaching the bottom of air gap 302. Device 100 containing the first coating of photosensitive passivation material 400 is baked at a temperature of one of 60° C. , 80° C. , or 120° C. , for example, for a duration of 60 seconds, 80 seconds, 100 seconds, or 120 seconds.

Next, photosensitive passivation material 400 may be applied in a second coating. The second coat of photosensitive passivation material 400 may be applied by spin coating between 2 ml and 3 ml of material 400 over the entire wafer surface, and covering the first coating of photosensitive passivation material 400. Due to its chemical viscosity and surface stress, the second coating of photosensitive passivation material 400 will likely not reach the bottom of air gap 302 and may cause the size of the top opening of air gap 302 to decrease or, in some cases, even completely close that opening. Device 100 containing the second coating of photosensitive passivation material 400 is baked at a temperature of 120° C. , 140° C. 160° C. , 180° C. , or 200° C. , for example, for a duration of 60 seconds, 80 seconds, 100 seconds, or 120 seconds.

Following the second coating, photosensitive passivation material 400 may be applied in a third coating. The third coating of photosensitive passivation material 400 may be applied by spin coating 2 ml, 3 ml 4 ml, or 5 ml of material 400 over the entire wafer surface, and covering the first and second coating of photosensitive passivation material 400. Due to its chemical viscosity and surface stress, the third coating of photosensitive passivation material 400 can close the top opening of air gap 302, and thus seal air gap 302. Device 100 containing the third coating of photosensitive passivation material 400 is baked at a temperature of 90° C. , 100° C. , 120° C. , or 140° C. , for example, a duration of 60 second, 80 second, 100 seconds, or 120 seconds. The number Of coatings, baking times, and the amount of photosensitive passivation material 400 in each application may vary depending on the size, position, and depth of air gap 302.

By the above described method of applying photosensitive passivation material 400, a portion of photosensitive passivation material 400 disposed in region 112 is deposited at the bottom of air gap 302, and another portion is deposited above air gap 302, thereby closing air gap 302. For example, a lower layer of photosensitive passivation material 400 of a thickness of between 100 nm and 10,000 nm may be deposited at the bottom of air gap 302, and an upper layer of photosensitive passivation material 400 of a thickness of between 2000 nm and 100,000 nm may be deposited on top of air gap 302.

Subsequently, photosensitive passivation material 400 may be partially removed using lithographic methods to expose the top surface of copper interconnect 106. After exposing the top surface of copper interconnect 106, the device 100 may be baked at a temperature of 90° C. , 100° C. , 120° C. , or 140° C. , for example, for a duration of 60 seconds, 80 seconds, 100 seconds, or 120 seconds.

Figure 5:
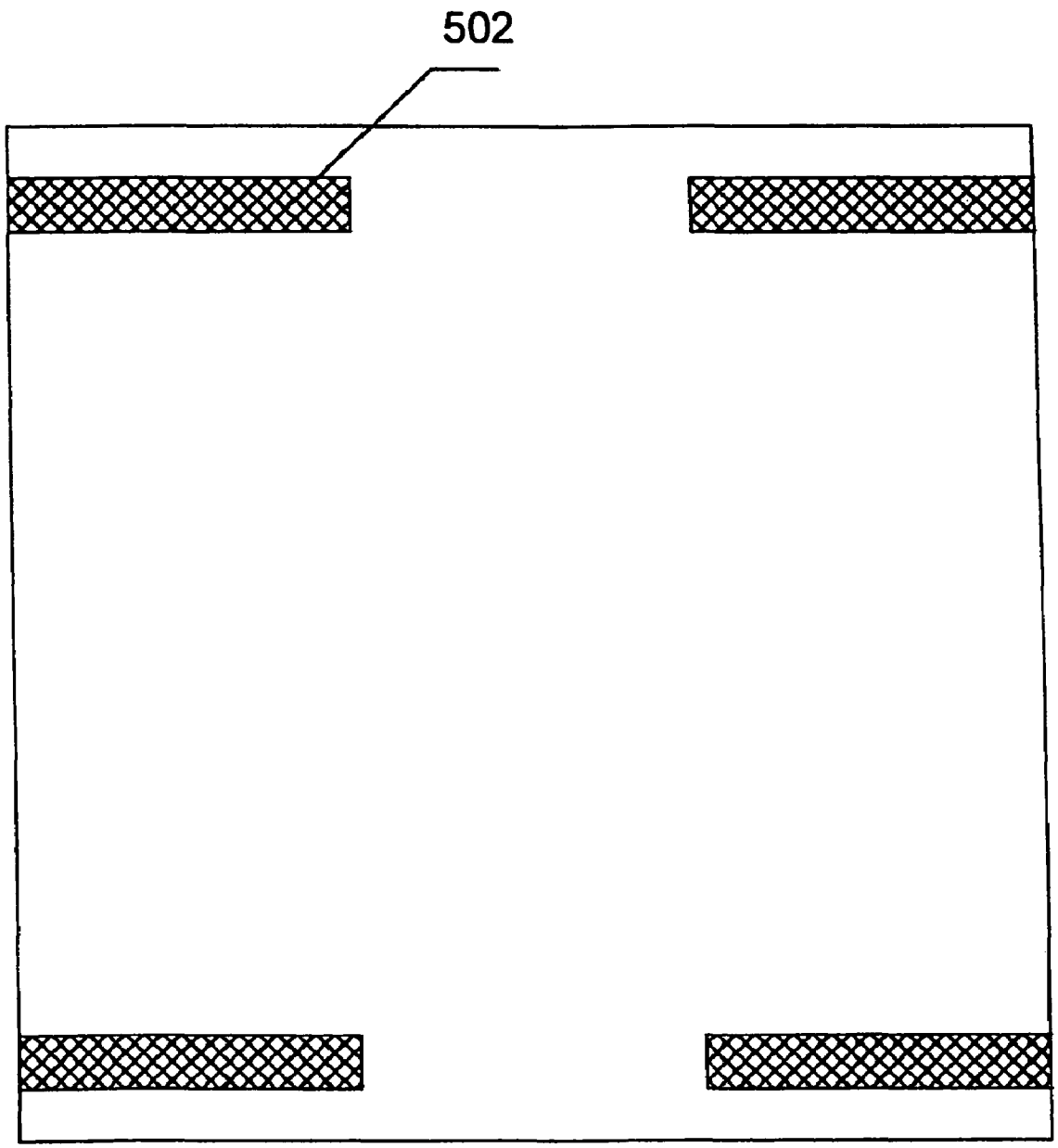
FIG. 5 illustrates an example of a mask plate consistent with embodiments of the present invention.

FIG. 5 shows a top view of a mask plate 500 containing an exemplary metal interconnect layout. Metal interconnect layout shows defined regions 502, each corresponding to region 112 on semiconductor device 100, reserved for forming air gaps. As illustrated in FIG. 5, reserved regions 502 are distributed symmetrically on mask plate 500. By forming air gaps symmetrically throughout semiconductor device 100, one may be able to manufacture a semiconductor device containing air gaps that is stable and able to evenly distribute mechanical and thermal stresses.

Thus, by forming air gaps in a device, one can effectively lower the permittivity in the dielectric layer of the Interconnect structure, and thus reduce the RC delay effect of the interconnect structure on the device performance.

While embodiments of the invention have been described In which an air gap is formed in a semiconductor device containing copper interconnect structures, the invention is not so limited. The benefits of the invention can also be realized by practice in semiconductor devices having interconnect structures formed of one or more conductive metals other than or in addition to copper.

Other embodiments of the invention will be apart to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor device, comprising:
   an etch barrier layer;
   a dielectric layer over the etch barrier layer;
   a conductive metal interconnect formed in a first region of the semiconductor device and through the dielectric layer and etch barrier layer;
   a metal barrier layer formed in a second region of the semiconductor device different from the first region and over the etch barrier layer;

an air gap formed in the second region and extending through the dielectric layer and to a lower photosensitive passivation material, the air gap including a top portion, a bottom portion, a first side portion, and a second side portion;

an upper photosensitive passivation material formed at least over the top portion of the air gap; and wherein the lower photosensitive passivation material is formed at the bottom portion of the air gap on the metal barrier layer, wherein the first side portion and the second side portion are perpendicular to the top portion and the bottom portion, wherein the metal barrier layer is formed below the bottom portion of the air gap, the bottom portion being opposite to the top portion and defining a bottom plane, and wherein the air gap is not disposed below the bottom plane.

2. The semiconductor device of claim 1, further comprising a plurality of the dielectric layers alternately layered with a plurality of the etch barrier layers;

wherein the air gap further extends through ones of the alternately layered dielectric layers and etch barrier layers above the metal barrier layer.

3. The semiconductor device of claim 1, wherein the second region does not include metal interconnects.

4. The semiconductor device of claim 1, further including a plurality of air gaps which are distributed symmetrically in the semiconductor device.

5. The semiconductor device of claim 1, wherein a thickness of the dielectric layer is between 200 nm and 10,000 nm, a thickness of the etch barrier layer is between 10 nm and 200 nm, and a thickness of the metal barrier layer is between 200 nm and 10,000 nm.

6. The semiconductor device of claim 1, wherein a thickness of the upper photosensitive passivation material is between 2000 nm and 100,000 nm, and a thickness of the lower photosensitive passivation material is between 100 nm and 10,000 nm.

7. The semiconductor device of claim 1, wherein a length, a width, and a depth of the air gap are between 2 um and 5 um, between 2 um and 5 um, and between 500 nm and 100,000 nm, respectively.

8. The semiconductor device of claim 1 wherein, in top view, the metal barrier layer does not overlap the dielectric layer.

9. The semiconductor device of claim 1 wherein the first side portion defines a first plane and the second side portion defines a second plane, wherein the first plane does not contact the second plane, and wherein the first side portion and the second side portion do not directly contact the metal barrier layer.

10. The semiconductor device of claim 1 wherein the upper photosensitive passivation material is formed at least over an entire top portion of the air gap, the top portion extending between the first side portion and the second side portion.

11. The semiconductor device of claim 1, wherein the metal barrier layer is not in direct contact with the conductive metal interconnect.

* * * * *